(12) United States Patent
George et al.

(10) Patent No.: US 10,302,687 B2
(45) Date of Patent: May 28, 2019

(54) FILTRATION THRESHOLDING

(71) Applicant: General Electric Company, Schenectady, NY (US)

(72) Inventors: Sheri George, Bangalore (IN); JeanFrancois Bureau, Lewistown, PA (US); Ranjith Kundoly Pushpangathan, Bangalore (IN); Haribaskar Govindasamy, Bangalore (IN)

(73) Assignee: General Electric Company, Schenectady, NY (US)

( * ) Notice: Subject to any disclaimer, the term of this patent is extended or adjusted under 35 U.S.C. 154(b) by 190 days.

(21) Appl. No.: 15/182,264

(22) Filed: Jun. 14, 2016

(65) Prior Publication Data

US 2017/0356944 A1    Dec. 14, 2017

(51) Int. Cl.
| | |
|---|---|
| *H04B 15/00* | (2006.01) |
| *G01R 29/26* | (2006.01) |
| *G01D 3/032* | (2006.01) |
| *G06F 3/05* | (2006.01) |
| *G06F 11/00* | (2006.01) |
| *H04B 1/10* | (2006.01) |
| *G10L 21/0208* | (2013.01) |

(52) U.S. Cl.
CPC .............. *G01R 29/26* (2013.01); *G01D 3/032* (2013.01); *G06F 3/05* (2013.01); *G06F 11/002* (2013.01); *G10L 21/0208* (2013.01); *H04B 1/1036* (2013.01); *H04B 15/00* (2013.01)

(58) Field of Classification Search
CPC .......... G01R 29/26; G01D 3/032; G06F 3/05; G06F 11/002; G01L 21/0208; H04B 1/1036; H04B 15/00

USPC .......................................................... 702/191
See application file for complete search history.

(56) References Cited

U.S. PATENT DOCUMENTS

| | | |
|---|---|---|
| 3,465,581 A | 9/1969 | Hohenberg |
| 4,596,150 A | 6/1986 | Kuhr |
| 4,829,834 A | 5/1989 | Masom |
| 4,899,598 A | 2/1990 | Gumaste et al. |
| 4,939,937 A | 7/1990 | Klauber et al. |

(Continued)

FOREIGN PATENT DOCUMENTS

| | | |
|---|---|---|
| EP | 0 399 180 A2 | 11/1990 |
| EP | 2 618 140 A2 | 7/2013 |
| WO | WO 2017/218648 | * 12/2017 |

OTHER PUBLICATIONS

International Search Report and Written Opinion issued in connection with corresponding PCT Application No. PCT/US2017/037438 dated Sep. 7, 2017.

*Primary Examiner* — Michael P Nghiem
(74) *Attorney, Agent, or Firm* — Mintz Levin Cohn Ferris Glovsky and Popeo, P.C.

(57) ABSTRACT

A measurement system includes a receiver configured to receive a measurement signal indicative of a parameter of a measured object. The measurement system also includes a processor configured to iteratively filter the measurement signal using a threshold value. The processor is also configured to adjust the threshold value for each iteration of filtration and determine a signal-to-noise ratio for each iteration of filtration. The processor is also configured to set a filter threshold value to the threshold value for the iteration based on the signal-to-noise ratio.

16 Claims, 10 Drawing Sheets

(56) References Cited

U.S. PATENT DOCUMENTS

| | | | |
|---|---|---|---|
| 5,182,953 A | 2/1993 | Ellinger et al. | |
| 5,307,690 A | 5/1994 | Hanazawa | |
| 5,323,659 A | 6/1994 | Wakamiya et al. | |
| 5,414,263 A * | 5/1995 | Haslam | G01J 1/46 |
| | | | 250/338.1 |
| 5,446,501 A * | 8/1995 | Takemoto | H04N 5/21 |
| | | | 348/615 |
| 5,515,736 A | 5/1996 | Kawagoe | |
| 5,708,216 A | 1/1998 | Garshelis | |
| 5,852,567 A * | 12/1998 | Xia | H04B 1/10 |
| | | | 702/76 |
| 5,887,335 A | 3/1999 | Garshells | |
| 6,490,934 B2 | 12/2002 | Garshelis | |
| 6,957,589 B2 | 10/2005 | Ueno et al. | |
| 7,454,978 B2 | 11/2008 | Schroeder et al. | |
| 7,533,584 B1 | 5/2009 | Wahl | |
| 7,821,321 B2 | 10/2010 | Zimlich | |
| 8,665,368 B2 | 3/2014 | Taylor et al. | |
| 8,692,545 B2 | 4/2014 | Shimada et al. | |
| 8,739,239 B2 | 5/2014 | Taylor | |
| 9,429,488 B2 | 8/2016 | Lu et al. | |
| 9,618,408 B2 | 4/2017 | Lu et al. | |
| 2002/0087203 A1 * | 7/2002 | Schmitt | A61N 1/37211 |
| | | | 607/60 |
| 2003/0228065 A1 * | 12/2003 | Kaltschmidt | G06T 5/10 |
| | | | 382/260 |
| 2004/0138859 A1 * | 7/2004 | Green | G01S 5/0257 |
| | | | 702/190 |
| 2006/0225521 A1 | 10/2006 | Von Beck et al. | |
| 2008/0129367 A1 | 6/2008 | Murata et al. | |
| 2009/0121920 A1 * | 5/2009 | Mullarkey | G01S 7/2921 |
| | | | 342/175 |
| 2009/0196471 A1 * | 8/2009 | Goetz | A61N 1/0551 |
| | | | 382/128 |
| 2010/0002817 A1 * | 1/2010 | Vrcelj | H04L 25/0212 |
| | | | 375/354 |
| 2011/0018726 A1 | 1/2011 | Gonzales | |
| 2012/0025528 A1 | 2/2012 | Sipila et al. | |
| 2013/0225095 A1 * | 8/2013 | Hong | H04B 15/00 |
| | | | 455/73 |
| 2013/0263654 A1 | 10/2013 | Pietron et al. | |
| 2013/0308489 A1 * | 11/2013 | Tomala | H04W 24/08 |
| | | | 370/252 |
| 2014/0105413 A1 * | 4/2014 | Clemow | G10K 11/178 |
| | | | 381/71.8 |
| 2014/0184210 A1 | 7/2014 | Campbell et al. | |
| 2014/0288452 A1 * | 9/2014 | Mittal | A61B 7/04 |
| | | | 600/513 |
| 2015/0019170 A1 * | 1/2015 | Solem | A61M 1/3653 |
| | | | 702/190 |
| 2015/0094592 A1 * | 4/2015 | Ravindran | A61B 8/5223 |
| | | | 600/453 |
| 2015/0168467 A1 * | 6/2015 | Haneda | G01R 23/165 |
| | | | 702/191 |
| 2015/0247887 A1 * | 9/2015 | Fukai | A61B 5/14532 |
| | | | 702/19 |
| 2016/0019906 A1 * | 1/2016 | Takahashi | G10L 21/0208 |
| | | | 704/228 |
| 2016/0045120 A1 * | 2/2016 | Friedman | A61B 5/04001 |
| | | | 600/544 |
| 2017/0026254 A1 * | 1/2017 | Adylov | H04L 43/04 |

* cited by examiner

FILTRATION THRESHOLDING

BACKGROUND

The subject matter disclosed herein generally relates to filtering one-dimensional data signals.

One-dimensional data signals (e.g., eddy current signals, ultrasound signals) may be used to measure properties of objects with non-invasive inspection techniques. These signals may contain noise from various sources that may interfere with proper inspection of a target object. The noise may include noise from electronic components, electromagnetic interference, variation in lift off, effects of external structures, or other environmental conditions that may interfere with the integrity of the data signals.

BRIEF DESCRIPTION

In one embodiment, a measurement system includes a receiver configured to receive a measurement signal indicative of a parameter of a measured object. The measurement system also includes a processor configured to iteratively filter the measurement signal using a threshold value. The processor is also configured to adjust the threshold value for each iteration of filtration and determine a signal-to-noise ratio for each iteration of filtration. The processor is also configured to set a filter threshold value to the threshold value for the iteration of filtration with the lowest signal-to-noise ratio.

In a second embodiment, a method includes receiving a measurement signal and filtering the measurement signal using multiple threshold values in multiple iterations. Filtering the measurement signal in each iteration of the multiple iterations includes incrementing the threshold value for the iteration from a previous threshold value for a previous iteration of the multiple iterations or from an initial threshold value. Filtering the measurement signal also includes filtering the measurement signal using the incremented threshold value. Furthermore, filtering the measurement signal includes computing a signal-to-noise ratio for the incremented threshold value. The method also includes selecting a filtering threshold value from the multiple threshold values, wherein the filtering threshold value corresponds to a highest signal-to-noise ratio of the multiple threshold values.

In a third embodiment, a non-transitory, computer-readable medium having instructions stored thereon. The instructions, when executed, are configured to cause the processor to select a filtering threshold value from multiple threshold values to filter a measurement signal. The filtering threshold value corresponds to a higher signal-to-noise ratio than any other of the multiple threshold values. Selecting the filtering threshold value includes iteratively computing the signal-to-noise ratio for each threshold value of the multiple threshold values in multiple iterations. Moreover, filtering the measurement signal in each iteration of the multiple iterations includes incrementing the threshold value for the iteration from a previous threshold value for a previous iteration of the multiple iterations or from an initial threshold value. Filtering the measurement signal also includes filtering the measurement signal using the incremented threshold value. Furthermore, filtering the measurement signal includes computing a signal-to-noise ratio for the incremented threshold value.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention are described below. In an effort to provide a concise description of these embodiments, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Figure 1:
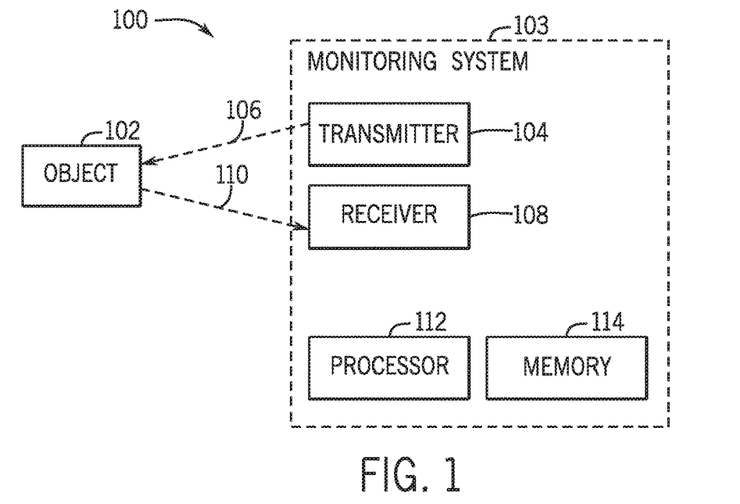
FIG. 1 illustrates an embodiment of a measurement system for measuring information about a target object.

FIG. 1 illustrates a block diagram of an embodiment of a measurement system 100 for measuring one or more properties of an object 102. The measurement system 100 includes a monitoring system 103 that oversees and/or monitors various parameters of the object 102, such as thickness, vibration, or other suitable parameters related to the object 102. The monitoring system 103 also includes a transmitter 104 that transmits wireless signals 106 that are changed, deflected, and/or reflected by the object 102 to a receiver 108 that receives wireless signals 110 that are used to non-invasively measure the one or more properties of the object 102. In some embodiments, the transmitter 104 and the receiver 108 may be included in a single transceiver. The signals 106, 110 may include one-dimensional signals. For example, the wireless signals 106, 110 may include ultrasound signals, remote-field eddy current (RFEC) signals, or other suitable wireless signals that may be used to provide information about at least a portion (e.g., surface) of the one or more properties of the object 102. However, these signal types may include noise that inhibits defect detection or other property measurements. Specifically, the noise may be noise that is generated from electronic components, electromagnetic interference, variation in manual measurements, unexpected and/or inconsistent sensor movement, or other interference from outside structures.

The monitoring system 103 includes a processor 112 and memory 114. The processor 112 may include any suitable processor for executing instructions that may be stored in the memory. The memory 114 may include one or more non-transitory, computer-readable media, such as read-only memory (ROM), random-accessible memory (RAM), compact discs, magnetic drives, and/or other suitable forms of data storage.

Figure 2:
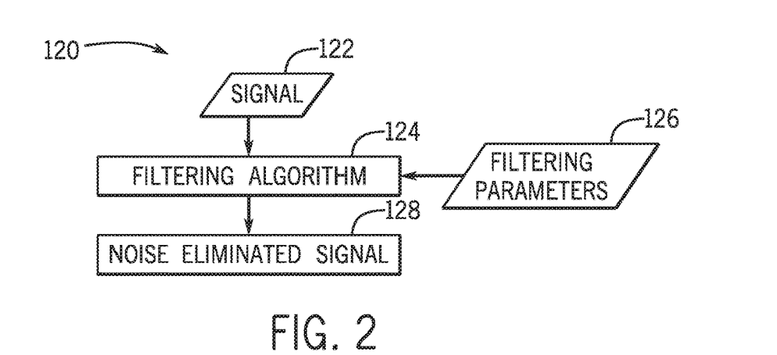
FIG. 2 is a flow diagram view of an embodiment of a noise-elimination process using a filtering algorithm.

The noise in these signals may be removed using a filtering algorithm. FIG. 2 illustrates a noise reduction process 120. The noise reduction process 120 includes receiving a signal 122, at the processor 112 from the receiver 108. The signal 122 includes some noise that may be inherent in the technology (e.g., eddy current) used to capture the measurements or may result from outside interference with the received signal. The processor 112 then deploys a filtering algorithm 124 to reduce an amount of noise in the signal 122. The filtering algorithm 124 deploys one or more filtering parameters 126 that direct the filtering algorithm on how to filter the signal 122. For example, the filtering parameters 126 may include frequencies to be filtered, a threshold of signal amplitude above which is not filtered, or other filtering settings that will change how much of the signal 122 is designated as noise. After the filtering algorithm 124 has been applied to the signal 122, a noise eliminated signal 128 is created that includes the signal with noise at least partially reduced or eliminated.

Noise removal from these signals may include using two kinds of filters—finite impulse response (FIR) and infinite impulse response (IIR) filters. These filters are specified using the type of filter and the frequency cut off value. The filter types that may be used include low pass, high pass, band pass and band stop filters. High pass filters pass frequencies above a specified cut off value while reducing or eliminating frequencies below the cut off value. Low pass filters pass frequencies below the cut off value while reducing or eliminating frequencies above the cut off value. Band pass filters pass frequencies within a range while reducing or eliminating all other frequencies. Band stop filters pass all frequencies except those in a specified range, which are reduced or eliminated. Choosing the correct filter parameters for FIR and IIR filters may be a very cumbersome process that is done by mainly trial and error. Inappropriate values input as the filter parameters may result in either loss of data via false positives indicating that data at the signal 122 is noise or false negatives that indicates noise as data. Thus, a proper selection of a cut off value may reduce noise to relatively low level without eliminating data. In some embodiments, this cut off value may be manually or automatically set to reduce noise to increase a signal-to-noise ratio (SNR).

Figure 3:
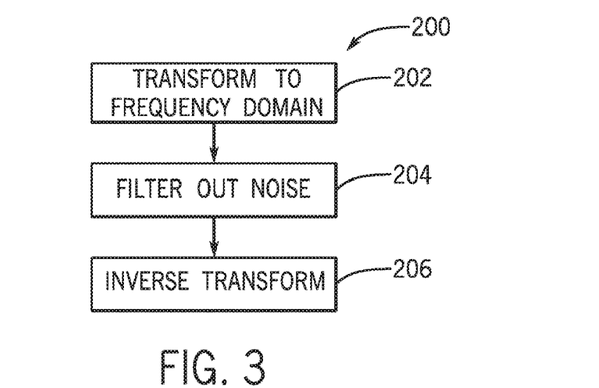
FIG. 3 is a flow diagram view of an embodiment of the filtering algorithm of FIG. 2.

FIG. 3 illustrates a filtering process 200. The filtering process 200 includes transforming the signal 122 to the frequency domain (block 202). As discussed below, the filtering technique described in the disclosure is based on Short-time Fourier Transform of the inspection data that is acquired. This technique includes decomposing the signal 122 into short time intervals and computing Fourier transforms for each of these time intervals.

Figure 4:
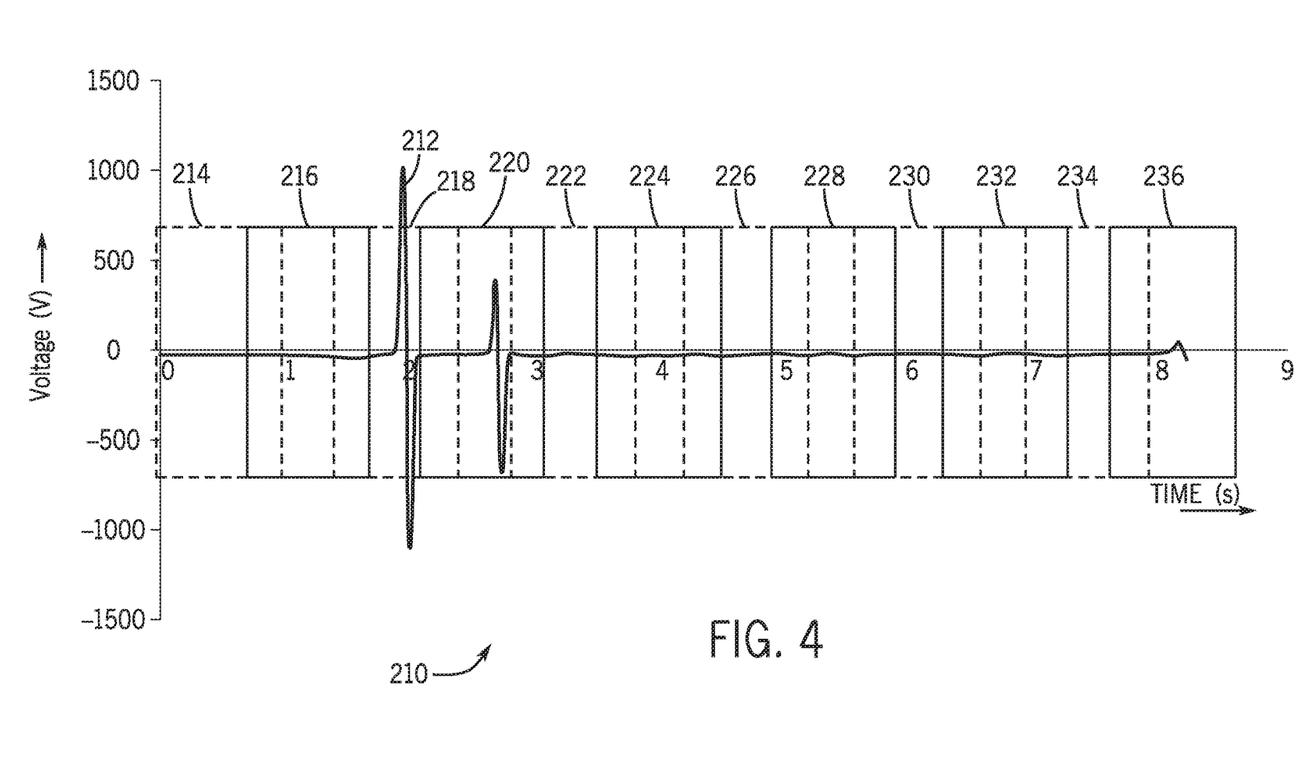
FIG. 4 is a graphical view of an embodiment of the measurement signal to be filtered.

FIG. 4 illustrates a graph 210 of a received signal 212 that includes a measurement of voltage over time. Although the illustrated embodiment of the graph 210 includes a measurement of voltage over time, the signal 212 may include any measurement over time, such as magnetism or other one-dimensional measurements. As illustrated, the signal 212 is divided into time intervals 214, 216, 218, 220, 222, 224, 226, 228, 230, 232, 234, and 236, collectively referred to as intervals 214-236. Furthermore, although the signal 212 has been divided into twelve one-second intervals, other signals may be divided into more or less intervals of larger or smaller durations. For example, the intervals may be half-second, quarter-second, one-second, 1.5-second, two-second, or another suitably sized interval.

Figure 5:
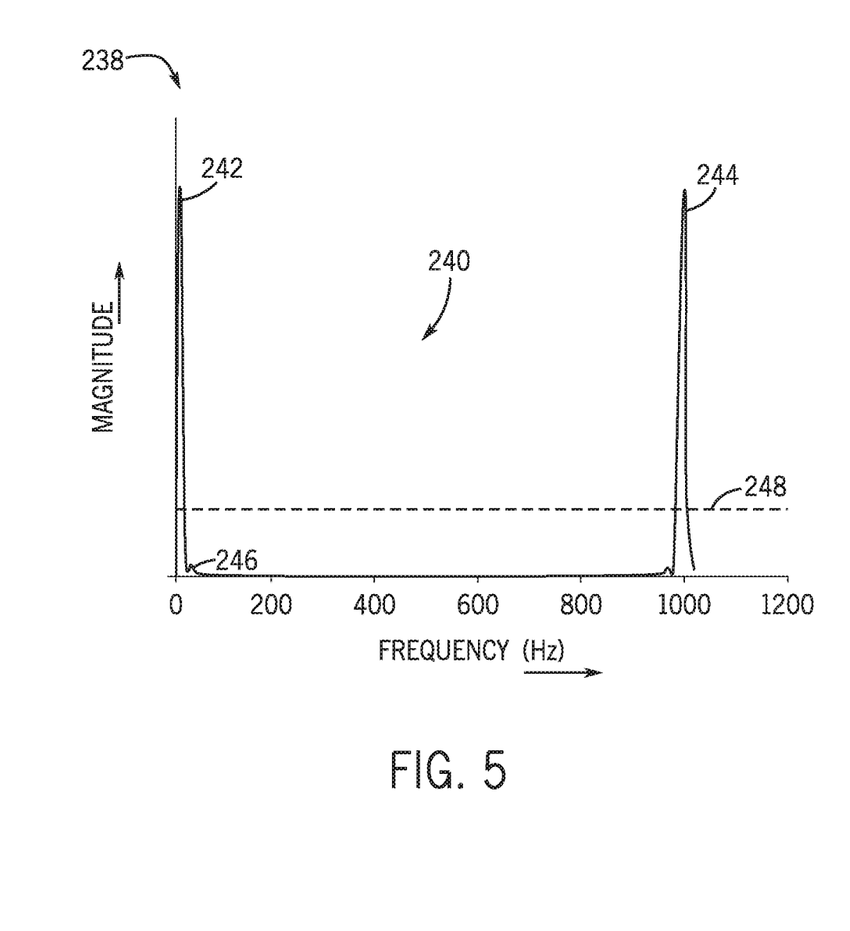
FIG. 5 is a graphical view of an embodiment of a frequency spectrum of the measurement signal of FIG. 4.

Using the intervals, finite Fourier transforms (FFT) are used to derive a complex value that allows computation of magnitude and phase of the FFT data. FIG. 5 illustrates a graph 238 of a transformed signal 240 as the FFT-computed magnitude versus frequency of the signal 212. In other words, the transformed signal 240 indicates what magnitude of frequency components may be found in the signal 212. As illustrated, the signal 212 includes peaks 242, 244, and 246. As illustrated, the peaks 242 and 244 have a relatively high magnitude. In other words, the signal 212 has relatively high magnitude of data having the frequencies of 0 and 1000 Hz. Since the peak 246 has a relatively low magnitude, the peak 246 may be attributed to noise.

Returning to FIG. 3, once the signal 212 has been transformed into the transformed signal 240 (block 202), noise is then filtered out from the transformed signal (block 204). For noise removal, thresholding is performed on the magnitude value of the Fourier data. If the magnitude of the Fourier data is below a specified threshold value, the Fourier values for that sample (both real and imaginary values) are reduced to zero. This corrected data is inversely Fourier transformed to obtain the noise filtered data as reconstructed data (block 206). In the example shown in FIG. 5, if the transformed signal 240 is filtered using threshold 248, the data corresponding to peaks 242 and 244 are relatively unaffected while the noise corresponding to peak 246 is reduced or eliminated.

Figure 6:
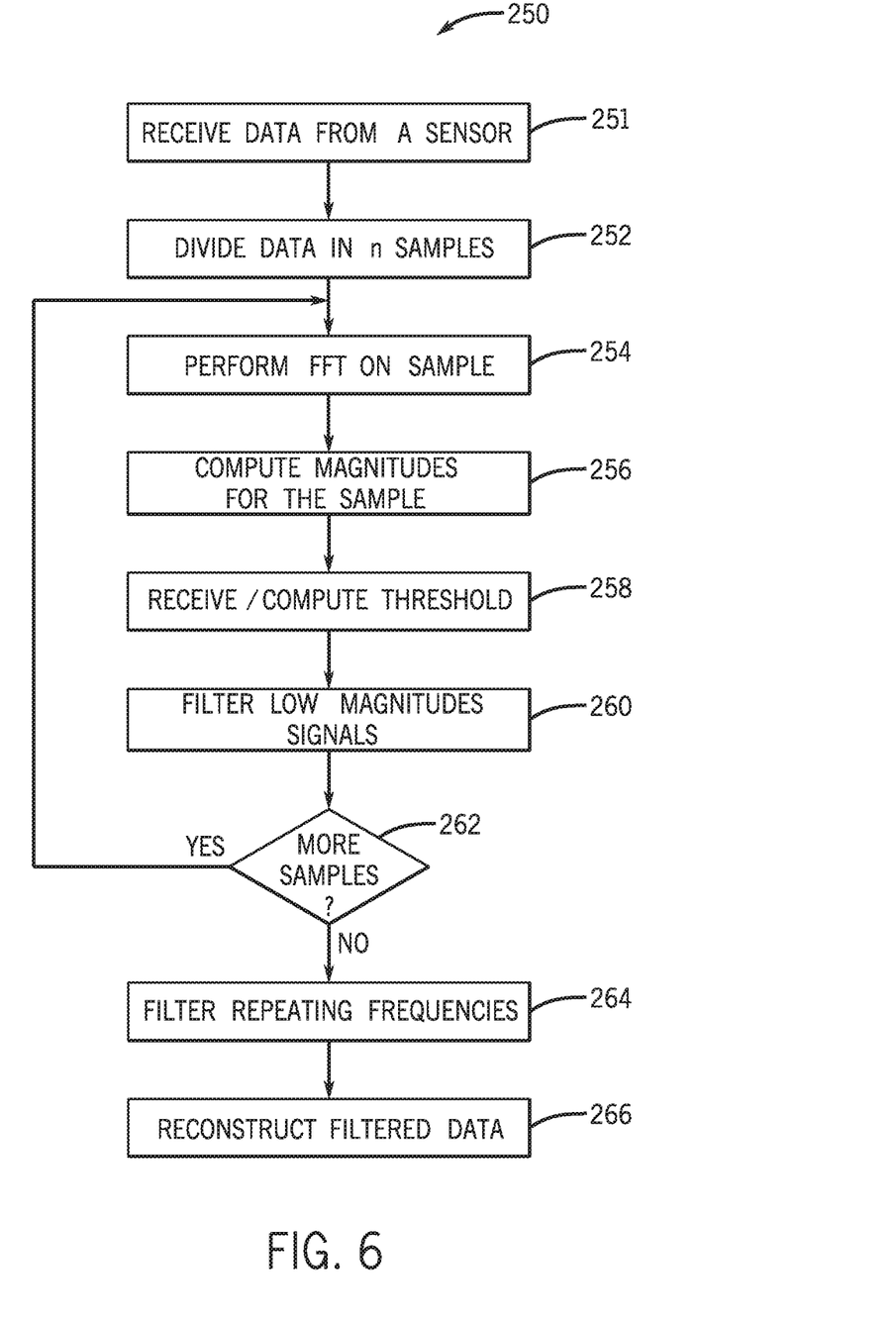
FIG. 6 is a flow diagram view of an embodiment of the filtration algorithm of FIG. 2.

FIG. 6 illustrates a process 250 that may be employed by the processor 112 to filter noise from the signal 212. The processor 112 receives data from a sensor (block 251). For example, the processor 112 receives the signal 212 from the receiver 108. The processor 112 then divides the data into n samples (block 252). N may be any number of samples. In some embodiments, the number of samples used is determined by a duration of the signal 212 and an interval for each sample. For each sample, the processor 112 calculates FFT to generate a transformed signal in the frequency domain (block 254). The processor 112 also computes magnitudes for the sample from the transformed signal (block 256). For example, the processor 112 determines the magnitude of each peak of the transformed signal. The processor 112 also receives or computes a threshold (block 258). Using the threshold values, the processor 112 filters low magnitude signals from the transformed signal to produce a filter-transformed signal (block 260). The processor 112 determines whether additional samples exist in the signal 212 and are to be filtered (block 262). If further samples exist, the processor 112 filters those samples as well.

The processor 112 determines if any frequencies are repeating and filters such repeating frequencies (block 264). For example, the processor 112 may determine whether a frequency exists in more than some threshold (e.g., 50%) of samples. Noise from certain sources, such as electronics, produces electromagnetic interference that repeats periodically. These repeating frequencies in the samples are eliminated by assigning the Fourier value for that sample (both real and imaginary values) to a relatively low magnitude. For example, the magnitude of such frequencies may be reduced to zero. The processor 112 takes all of the filtered samples and reconstructs them into filtered data using an inverse Fourier transform (block 266).

As discussed above, the processor 112 makes a threshold determination based on a received threshold and/or automatic tuning of a threshold. Conventional noise removal using filters via FIR or IIR passes signals having frequency components above or below a specified cut off frequency. In some cases, it may not be feasible or even possible to specify a fixed frequency above or below which all the data can be classified as noise. Choosing the correct filter parameters for FIR and IIR filters may be very cumbersome and are generally done using a trial and error method. Furthermore, inappropriate values of the filter parameters may result in either loss of data or may result in false positives or false negatives. Thus, to reduce likelihood of data loss and to simplify filtration for users, the processor 112 determines a suitable threshold from user input and/or automatic determination.

Figure 7:
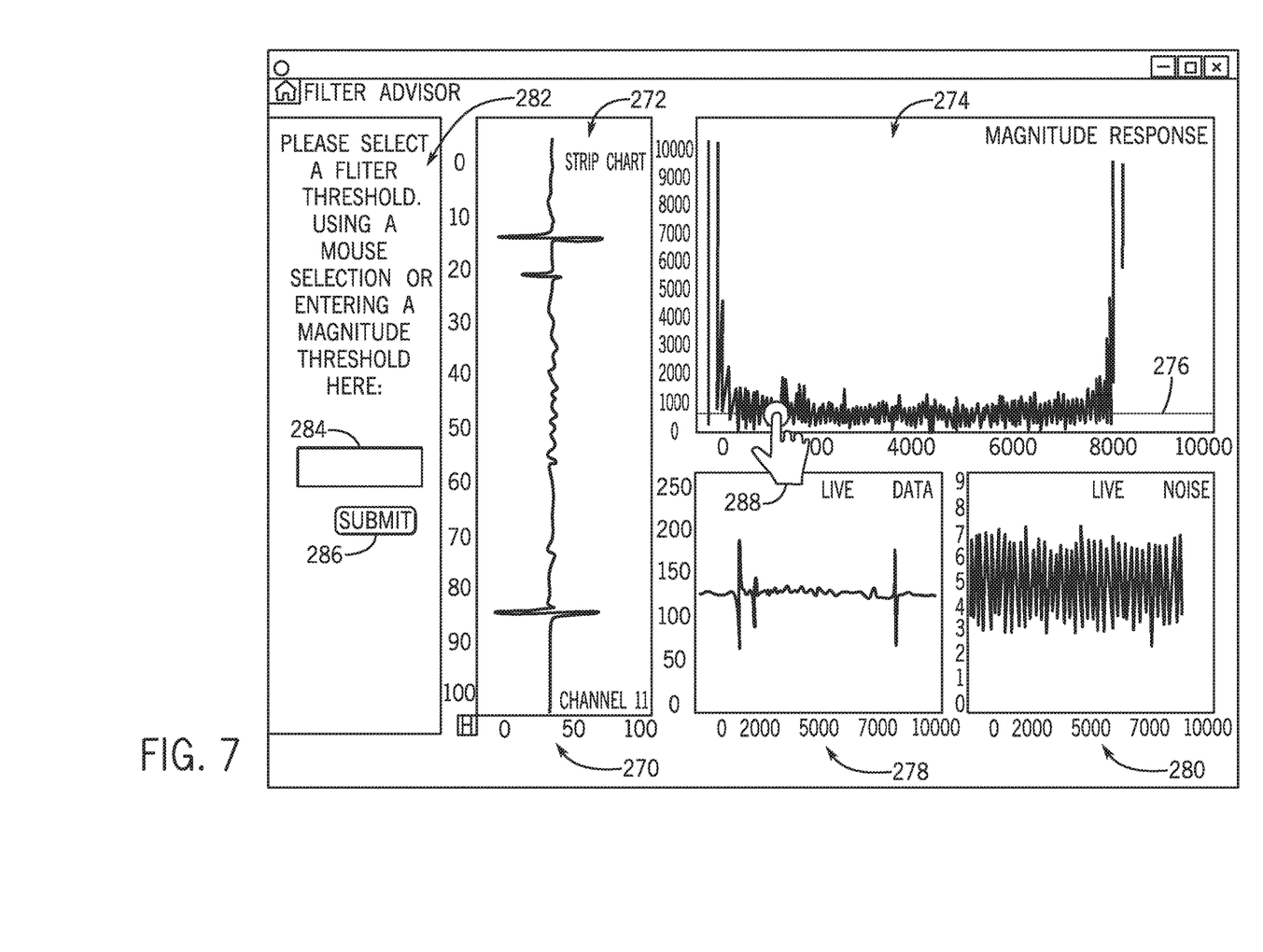
FIG. 7 illustrates a manual entry screen for entering and/or manipulating a threshold value for filtration.

FIG. 7 illustrates a threshold determination screen 270, driven by the processor 112, that may be used by the processor 112 to at least partially assist in determining a filter threshold. As illustrated, the threshold determination screen 270 includes a time domain region 272 that illustrates a graphical representation of the signal 212 in the time domain. The threshold determination screen 270 includes a frequency domain region 274 that illustrates a graphical representation of the signal 212 in the frequency domain. For example, the frequency domain region 274 may represent FFT data of the signal 212. The frequency domain region 274 also illustrates a line 276 indicative of a threshold value below which values are to be filtered. Using the threshold value and the frequency domain calculations, portions of the signal 212 may be categorized as noise or data. Signals (including or composed of sinusoids) that are classified as data in the signal 212 may be represented in a data region 278, and signals classified as noise in the signal 212 may be represented in a noise region 280. In other words, the graphical representation of the data region 278 and the noise region 280 provide visual feedback regarding filtering results using the threshold indicated by the line 276.

The threshold determination screen 270 may also include a threshold selection region 282. The threshold selection region 282 may include text instructing a user to use input structures to enter a value for and/or manipulate the line 276. The input structures include a keyboard, a mouse, a touchscreen, a microphone, and/or other input devices that may be used to receive inputs from a user and translate the inputs for use by the processor. The threshold selection region 282 may also include a threshold entry 284 that may be used to manually enter a threshold value. The threshold selection region 282 may also include a button 286 to provide confirmation or to submit the entered value as the magnitude. In some embodiments, the entered value may be relative to a previous value. For example, the entered value may be "+5" to increase the threshold by five units or "−2" to decrease by two units. The threshold selection region 282 may include instructions for manipulating a manually entered threshold value. For example, a cursor 288 may be used to drag the line 276 up or down.

Figure 8:
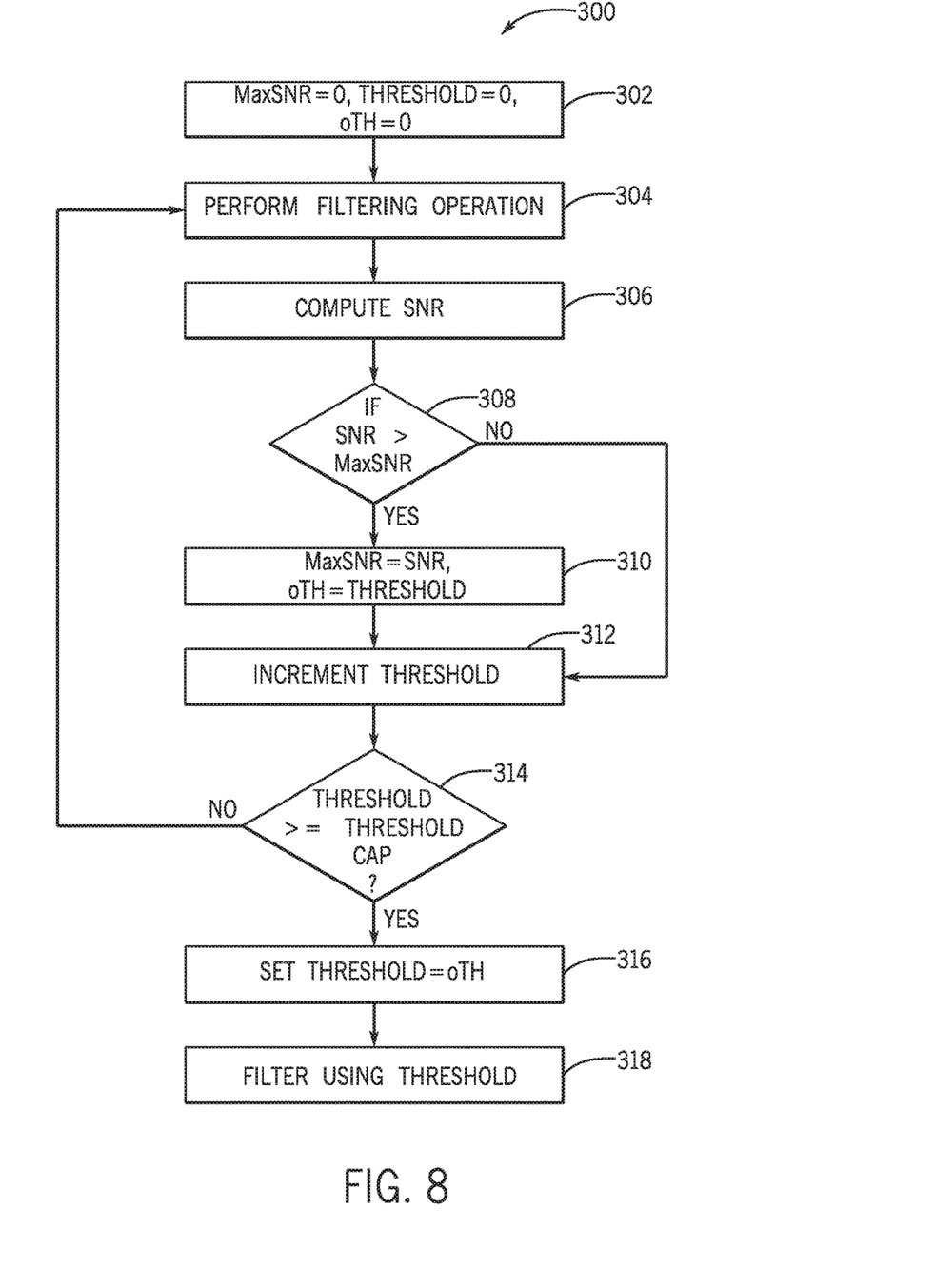
FIG. 8 illustrates a process for automatic threshold value determination.

Additional or alternative to user-assisted threshold determinations, the processor 112 may use more highly automated threshold determinations to fine-tune the threshold or to select the threshold outright. FIG. 8 illustrates a process 300 for determining a threshold. The processor 112 initializes a maximum signal-to-noise ratio (maxSNR) value, an optimum threshold (oTH) register value, and a threshold at a relatively low value (block 302). For example, the maxSNR value, the oTH register value, and the threshold may be initialized to 0. The maxSNR value tracks the highest signal-to-noise ratio calculated while the process 300 increments the threshold as previously described, and the oTH register tracks the optimum, (e.g. lowest), threshold that corresponds to the maxSNR.

The filtering operation is performed using the threshold (block 304). The processor 112 computes a signal-to-noise ratio determined when the threshold value is used to filter the signal (block 306). Specifically, the SNR is determined using a signal and a noise from the reconstructed data. The signal portion of the reconstructed data is the maximum or peak value of the reconstructed data, and the noise portion of the reconstructed data is the standard deviation of the reconstructed data. The processor 112 then determines whether the computed SNR is greater than the currently stored maxSNR (block 308). Thus, in the first pass, the first SNR computation replaces the initial value (e.g., 0) of the maxSNR, and the initial threshold value replaces the initial oTH register value. In each iteration, if the computed SNR exceeds the currently stored maxSNR value, the maxSNR value is replaced by the computed SNR for the iteration of the threshold and the oTH register value is replaced by the threshold (block 310). If the computed SNR does not exceed the currently stored maxSNR or after the maxSNR value is replaced by the computed SNR, the threshold is incremented for additional iterations (block 312).

In some embodiments, the threshold may be incremented consistently using a constant value. For example, the threshold may be incremented by a magnitude of 50 each iteration. Additionally or alternatively, the threshold incremental value may be based on whether a manual selection has previously occurred. In other words, if a manual selection has been made, the incremental value may be smaller since the automated portion may be intended to fine-tune the selection.

Furthermore, in such embodiments, a smaller range of threshold values may be submitted for testing to determine the threshold level when a manual determination has previously been made. For example, a threshold cap may be reduced relative to a value previously determined manually. Moreover, the automated determination may back down some values (e.g., 100 units) from the manually determined value for the first iteration in case the user has clipped some of the data from the signal 212 with the set threshold value. In other words, the processor 112 may use the automated process to reduce errors and/or fine-tune a manually determined threshold.

In some embodiments, the threshold value may vary relative to the SNR or SNR delta between iterations. Thus, as the SNR delta decreases, the incremental amount may decrease. Additionally or alternatively, if SNR decreases between iterations, the processor 112 may revert an amount smaller than the previous increment to determine the SNR for a threshold value between the previous two SNR. Thus, in such embodiments, if a higher SNR threshold value is missed due to a threshold increment that was too large, the processor 112 may revert back to smaller threshold values that may find the higher SNR.

The processor 112 determines whether the incremented threshold is greater than or equal to a threshold cap (block 314). The threshold cap is the highest threshold value to be evaluated by the automated threshold determination. If the cap has been exceeded, the iterations have been completed. Otherwise, the processor 112 continues calculating SNR for each threshold value. In some embodiments, the processor may back the increments of threshold changes down from the threshold cap to catch cases where the maxSNR may be relatively close to the threshold cap. Once the iterations have been completed, the processor determines that the optimum threshold value (oTH) corresponding to the maxSNR value is the threshold for filtering. Therefore, the threshold to be used is set to the value stored in oTH resulting in the maxSNR. (block 316). Once the threshold has been set using the oTH, the signal 212 is then filtered using the determined threshold (block 318).

Figure 9A:
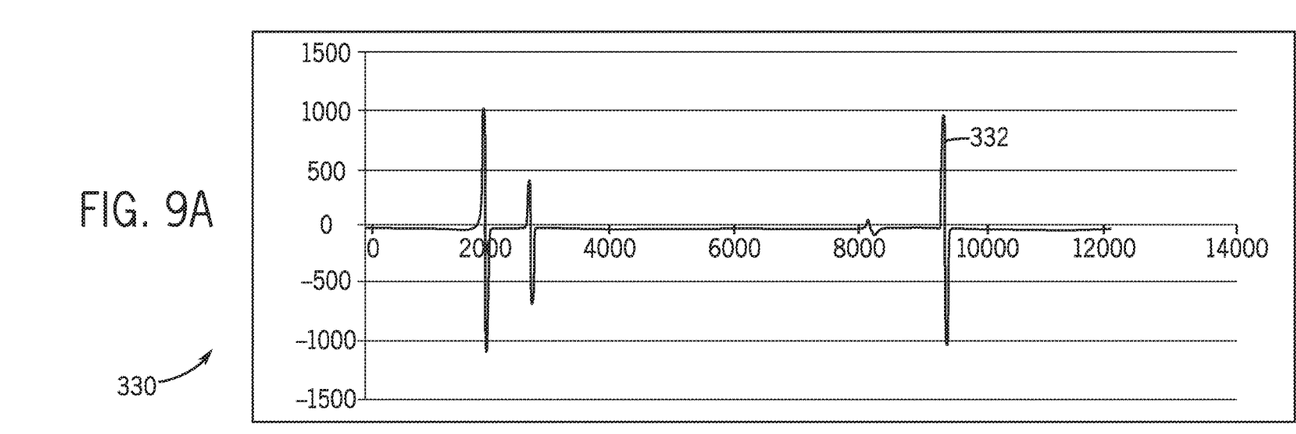
FIG. 9A illustrates a graphical view of an embodiment of an unfiltered horizontal component of a measurement signal.
Figure 9B:
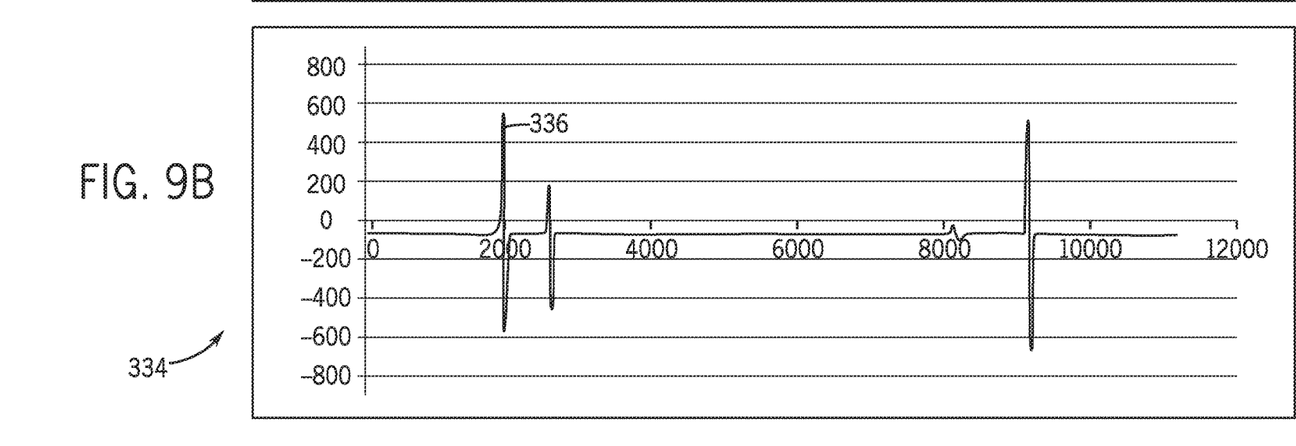
FIG. 9B illustrates a graphical view of an embodiment of a filtered horizontal component of a measurement signal corresponding to the unfiltered horizontal component of FIG. 9A.

FIGS. 9A and 9B illustrate an embodiment of filtered results of a horizontal component of a one-dimensional measurement (e.g., eddy current and ultrasound). FIG. 9A illustrates a graph 330 of an unfiltered signal 332. FIG. 9B illustrates a graph 334 of a filtered signal 334 generated using the foregoing techniques.

Figure 10A:
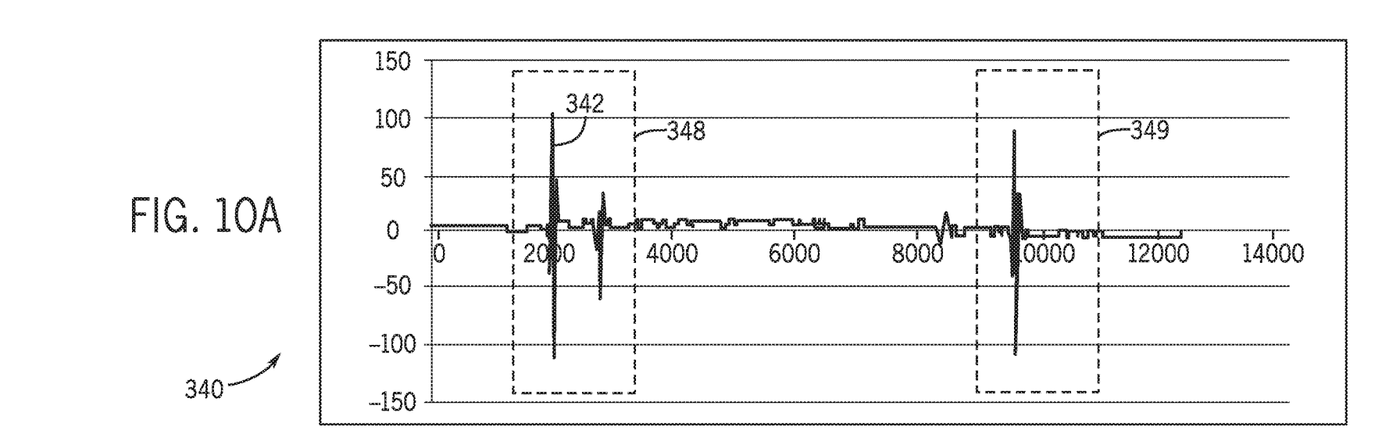
FIG. 10A illustrates a graphical view of an embodiment of an unfiltered vertical component of a measurement signal.
Figure 10B:
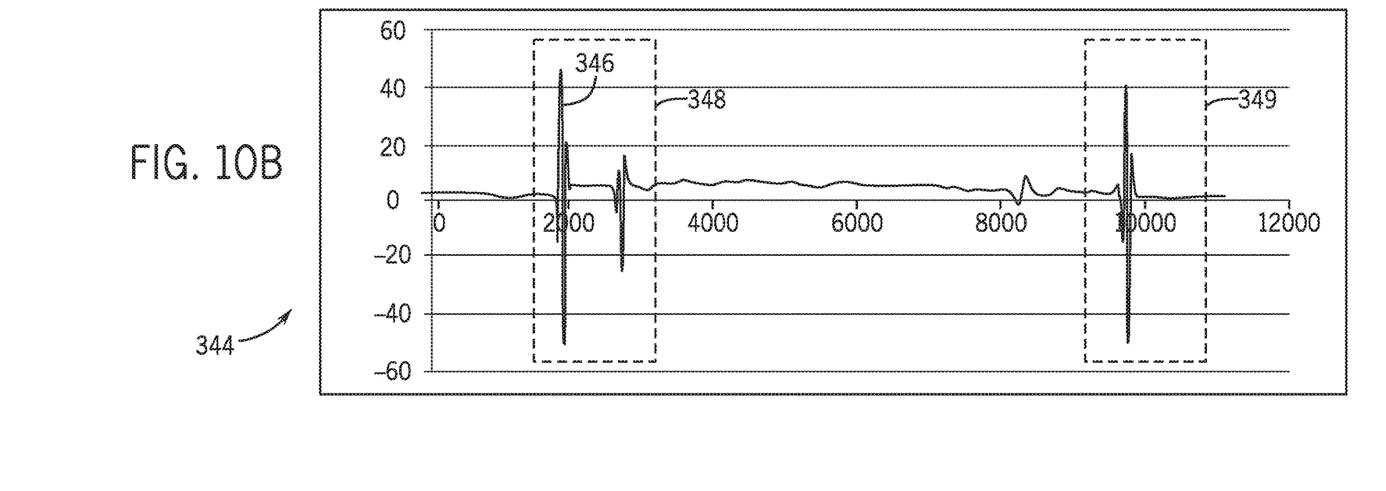
FIG. 10B illustrates a graphical view of an embodiment of a filtered vertical component of a measurement signal corresponding to the unfiltered vertical component of FIG. 10A.

Similarly, FIGS. 10A and 10B illustrates filtered results of a vertical component of the one-dimensional measurement of FIGS. 9A and 9B. FIG. 10A illustrates a graph 340 of an unfiltered signal 342. FIG. 10B illustrates a graph 344 of a filtered signal 346 generated using the foregoing techniques. Furthermore, the graphs 340 and 344 may be broken down into sub-regions 348 and 349 to emphasize the filtration effects on the filtered signal 346 from the unfiltered signal 342. The filtered signal 346 includes less noise that has relatively low amplitude values.

Figure 11A:
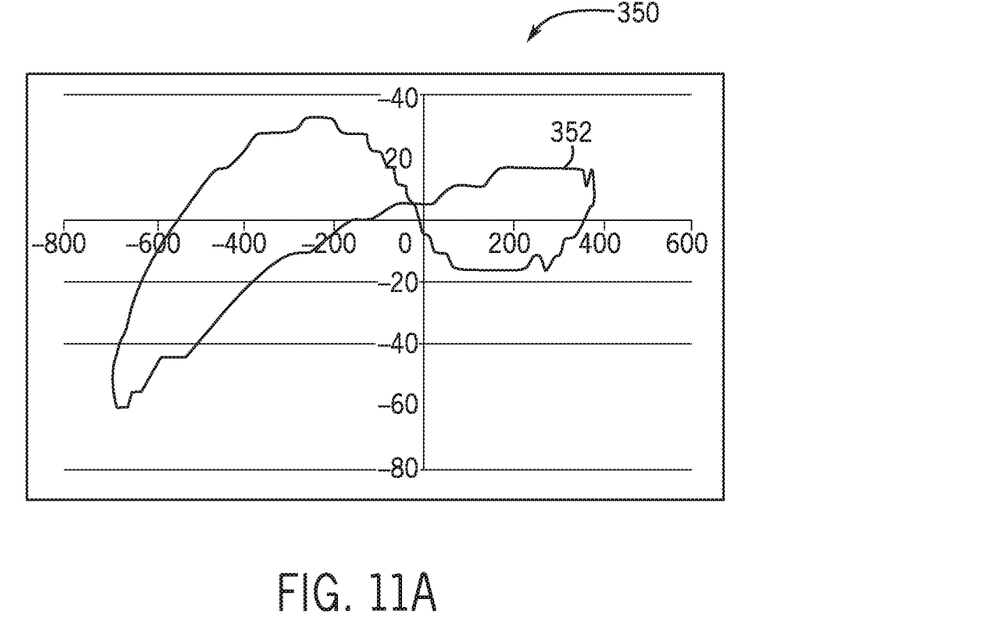
FIG. 11A illustrates a graphical view of an embodiment of a Lissajous curve of an unfiltered portion of a measurement signal.
Figure 11B:
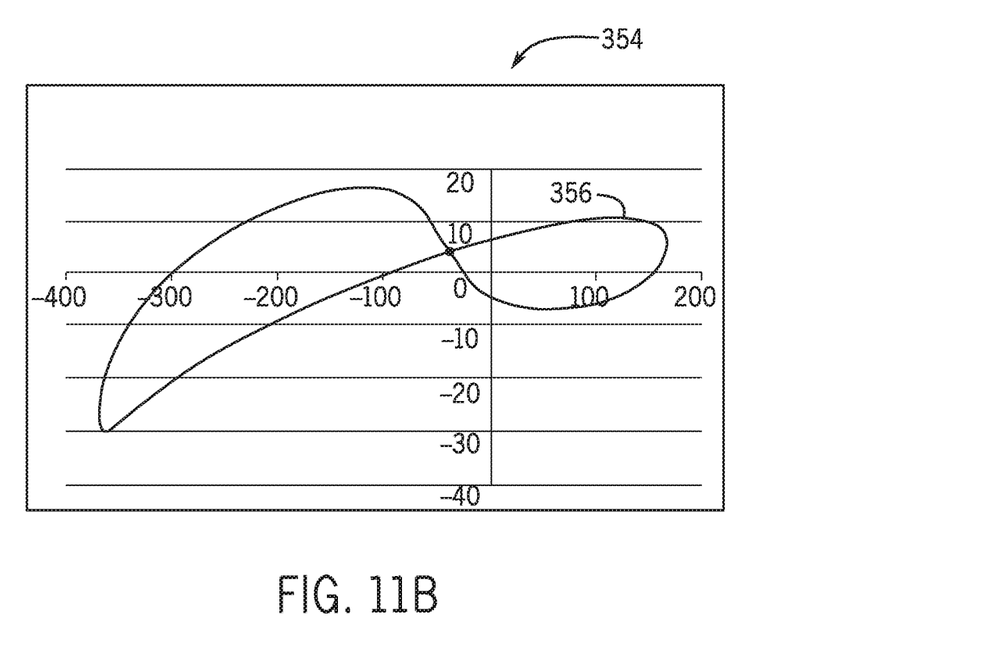
FIG. 11B illustrates a graphical view of an embodiment of a Lissajous curve of a filtered portion of a measurement signal corresponding to the unfiltered portion of FIG. 11A.

FIGS. 11A and 11B illustrate a Lissajous curve corresponding to the region 348. FIG. 11A includes a graph 350 of a Lissajous curve 352 that corresponds to the unfiltered data of the graphs 330 and 340 corresponding to the region 348. FIG. 11B includes a graph 354 of a Lissajous curve 356 that corresponds to the filtered data of the graphs 334 and 344.

Figure 12A:
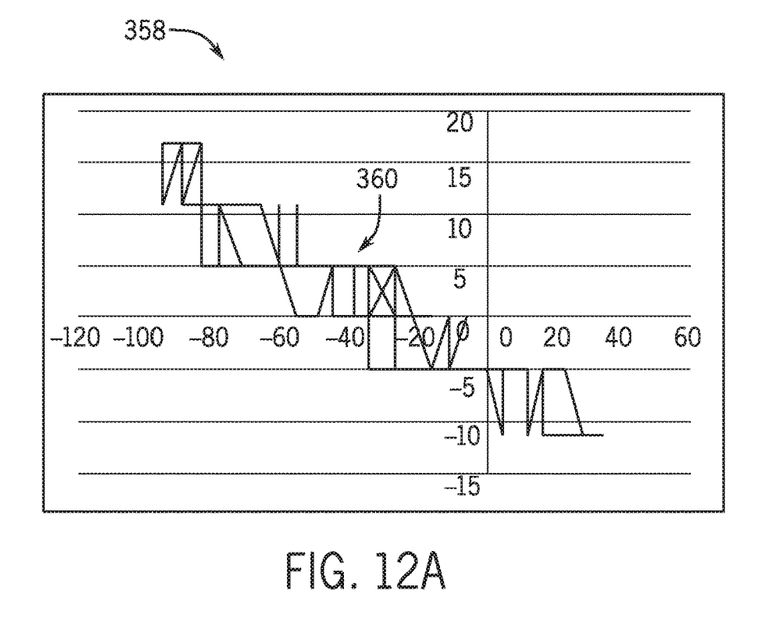
FIG. 12A illustrates a graphical view of an embodiment of a Lissajous curve of another unfiltered portion of a measurement signal.
Figure 12B:
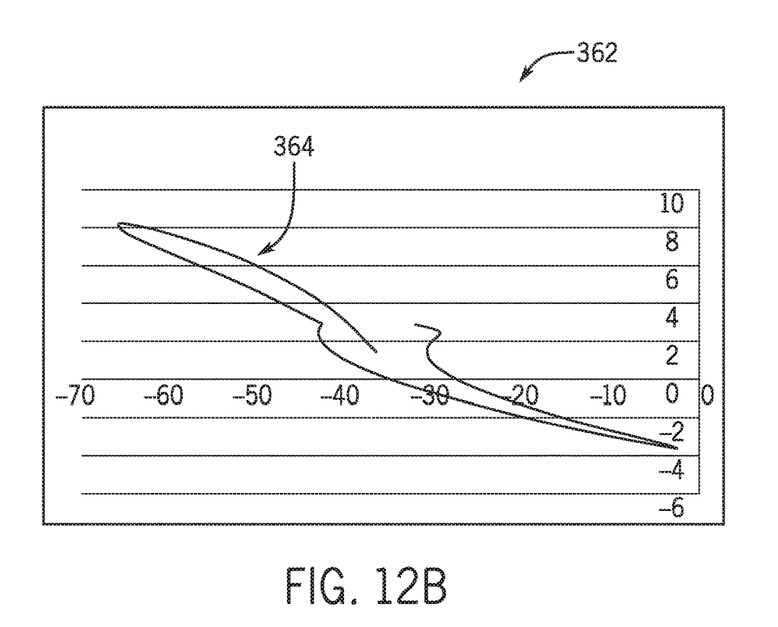
FIG. 12B illustrates a graphical view of an embodiment of a Lissajous curve of a filtered portion of a measurement signal corresponding to the unfiltered portion of FIG. 12A.

Similarly, FIGS. 12A and 12B illustrates a Lissajous curve corresponding to the region 349. FIG. 12A includes a graph 358 of a Lissajous curve 360 that corresponds to the unfiltered data of the graphs 330 and 340 corresponding to the region 349. FIG. 12B includes a graph 362 of a Lissajous curve 364 that corresponds to the filtered data of the graphs 334 and 344.

It may be understood that the foregoing processes may be embodied using hardware, software, or some combination thereof. For example, the processor 112 may be used to perform instructions stored in the memory 114 that are configured to cause the processor to perform the portions of the processes, when executed. In other words, the received signals may be at least partially digitally filtered and/or at least partially filtered using analog circuit components.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

This written description uses examples to disclose the subject matter, including the best mode, and to enable any person skilled in the art to practice the invention, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A measurement system comprising:
   a receiver configured to receive a measurement signal indicative of a parameter of a measured object; and
   a processor configured to:
      iteratively filter the measurement signal using a threshold value of a predefined magnitude for each of a plurality of iterations;
      adjust the threshold value for an iteration of filtration of the plurality of iterations when a signal-to-noise ratio computed for the iteration of filtration is not a highest signal-to-noise ratio among each signal-to-noise ratio computed for each iteration of filtration;
      compute a signal-to-noise ratio for each iteration of filtration; and
      set a filtering threshold value to the threshold value for an iteration of filtration with the highest signal-to-noise ratio among each signal-to-noise ratio computed for each iteration of filtration,
   wherein iteratively filtering the measurement signal comprises:
      dividing the measurement signal into a plurality of samples;
      computing a magnitude for each sample;
      filtering signals from the plurality of samples having a magnitude lower than the threshold value for each iteration of filtration; and
      reconstructing the plurality of samples into filtered data after filtering the signals from the plurality of samples.

2. The measurement system of claim 1, wherein processor is configured to compute the signal-to-noise ratio for each iteration of filtration by:
   setting a signal value to a peak value of the filtered data for each iteration of filtration;
   setting a noise value to a standard deviation of the filtered data for each iteration of filtration; and
   dividing the signal value by the noise value.

3. The measurement system of claim 1, wherein the processor is configured to filter frequency magnitudes that repeat across multiple samples of the plurality of samples.

4. The measurement system of claim 1, wherein the measurement signal comprises at least one of an eddy current signal and an ultrasound signal.

5. A method comprising:
receiving, by a receiver, a measurement signal indicative of a parameter of a measured object;
iteratively filtering, by a processor, the measurement signal using a threshold value of a predefined magnitude for each of a plurality of iterations, wherein iteratively filtering the measurement signal comprises:
incrementing the threshold value for an iteration of filtration when a signal-to-noise ratio computed for the iteration of filtration is not a highest signal-to-noise ratio among each signal-to-noise ratio computed for each iteration of filtration;
filtering the measurement signal using the threshold value for each iteration of filtration; and
computing a signal-to-noise ratio for each iteration of filtration; and
setting, by the processor, a filtering threshold value to the threshold value for an iteration of filtration with the highest signal-to-noise ratio among each signal-to-noise ratio computed for each iteration of filtration,
wherein, when the threshold value is incremented, the incrementing of the threshold value comprises:
incrementing the threshold value using a first value if a manual threshold setting has been previously completed; and
incrementing the threshold value using a second value if the manual threshold setting has not been previously completed.

6. The method of claim 5, further comprising filtering the measurement signal based at least in part on the filtering threshold value.

7. The method of claim 5, further comprising:
dividing the measurement signal into a plurality of samples;
determining if a frequency exists in more than a threshold number of samples; and
if the frequency exists in more than the threshold number of samples, removing the frequency from the measurement signal.

8. The method of claim 5, wherein, when the threshold value is incremented, the incrementing of the threshold value comprises adding a constant value to the threshold value.

9. The method of claim 5, wherein, when the threshold value is incremented, the incrementing of the threshold value comprises incrementing the threshold value by an amount that is proportional to a signal-to-noise ratio delta between two previous iterations of filtration.

10. The method of claim 5, wherein the manual threshold setting comprises receiving an input of a manual threshold value.

11. The method of claim 10, wherein the manual threshold setting comprises:
receiving a manipulation of the manual threshold value; and
presenting information about filtration results based at least in part on the manipulation.

12. A non-transitory, computer-readable medium having instructions stored thereon for a measurement system including a receiver and a processor, wherein the instructions, when executed, are configured to cause the processor to:
iteratively filter a measurement signal using a threshold value of a predefined magnitude for each of a plurality of iterations, wherein iteratively filtering the measurement signal comprises:
incrementing the threshold value for an iteration of filtration when a signal-to-noise ratio computed for the iteration of filtration is not a highest signal-to-noise ratio among each signal-to-noise ratio computed for each iteration of filtration;
filtering the measurement signal using the threshold value for each iteration of filtration; and
computing a signal-to-noise ratio for each iteration of filtration; and
set a filtering threshold value to the threshold value for an iteration of filtration with the highest signal-to-noise ratio among each signal-to-noise ratio computed for each iteration of filtration, wherein
the measurement signal is received by the receiver and is indicative of a parameter of a measured object, and
when the threshold value is incremented, the incrementing of the threshold value comprises:
incrementing the threshold value using a first value if a manual threshold setting has been previously completed; and
incrementing the threshold value using a second value if the manual threshold setting has not been previously completed.

13. The non-transitory, computer-readable medium of claim 12, wherein the instructions are configured to cause the processor to filter the measurement signal using the filtering threshold value.

14. The non-transitory, computer-readable medium of claim 12, wherein the measurement signal comprises a one-dimensional measurement signal.

15. The non-transitory, computer-readable medium of claim 12, wherein, when the threshold value is incremented, the incrementing of the threshold value comprises adding a constant value to the threshold value.

16. The non-transitory, computer-readable medium of claim 12, wherein when the threshold value is incremented, the incrementing of the threshold value comprises incrementing the threshold value by an amount that is proportional to a signal-to-noise ratio delta between previous iterations of filtration.

* * * * *